United States Patent
Earl (10) Patent No.: US 10,666,242 B1
(45) Date of Patent: May 26, 2020

(54) CIRCUITS AND METHODS FOR REDUCING ASYMMETRIC AGING EFFECTS OF DEVICES

(71) Applicant: Cadence Design Systems, Inc., San Jose, CA (US)

(72) Inventor: Jeffrey Earl, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 180 days.

(21) Appl. No.: 15/726,354

(22) Filed: Oct. 5, 2017

(51) Int. Cl.
*H03K 5/13* (2014.01)
*H03K 5/133* (2014.01)
*H03K 5/06* (2006.01)
*H03K 5/00* (2006.01)

(52) U.S. Cl.
CPC .............. *H03K 5/133* (2013.01); *H03K 5/06* (2013.01); *H03K 2005/00019* (2013.01)

(58) Field of Classification Search
None
See application file for complete search history.

(56) References Cited

U.S. PATENT DOCUMENTS

| | | | | |
|---|---|---|---|---|
| 2015/0188527 A1* | 7/2015 | Francom | ................. | H03K 5/14 327/158 |
| 2015/0277393 A1* | 10/2015 | Liu | ........................ | H03K 3/012 307/129 |
| 2016/0204781 A1* | 7/2016 | Plusquellic | ...... | H03K 19/00323 326/8 |
| 2018/0091125 A1* | 3/2018 | Carlson | .................... | H03K 5/06 |
| 2018/0367128 A1* | 12/2018 | Vezyrtzis | ............. | H03K 3/0372 |
| 2019/0074829 A1* | 3/2019 | Fukuoka | ................... | G06F 1/28 |

* cited by examiner

*Primary Examiner* — Lincoln D Donovan
*Assistant Examiner* — Khareem E Almo
(74) *Attorney, Agent, or Firm* — Foley & Lardner LLP (57) ABSTRACT

A delay line can include a number of delay elements connected in series, each selected to impart an overall delay to an input signal. The delay line can include delay selection logic to select a subset of the delay elements to delay the input signal. The delay line can include delay element enable logic to enable the selected subset of the delay elements to delay the input signal. Further, the remaining delay elements can be disabled from contributing any delay to the input signal, and a respective periodic signal can be provided to at least one of the remaining delay elements to cause the at least one remaining delay elements to output an output signal that is a function of the respective periodic signal and that has a frequency less than that of the input signal. This configuration can reduce asymmetric aging effects on the delay line.

20 Claims, 8 Drawing Sheets

CIRCUITS AND METHODS FOR REDUCING ASYMMETRIC AGING EFFECTS OF DEVICES

TECHNICAL FIELD

The present disclosure relates generally to integrated circuits, and more particularly to methods and apparatuses for reducing effects of asymmetric aging in circuits on output signals of the circuits.

BACKGROUND

Electronic circuits can include delay lines that can be configured to delay signals such as clock signals with a predetermined delay. The delay lines can constitute delay elements that are connected in series, where each delay element imparts a fixed delay. A desired number of delay elements in the delay line can be selected, based on the desired total delay, to delay the signal. The unused delay elements in the delay line can be deactivated or maintained in their respective static states to save power.

SUMMARY

A delay line can include n delay elements connected in series each of which can be selected to impart an overall delay to an input signal. The delay line can include a delay selection logic that can select a subset of the delay elements to delay the input signal. The delay line can also include a delay element enable logic configured to concurrently enable the selected subset of the delay elements to delay the input signal. Further, a respective periodic signal can be provided to at least one of the remaining delay elements to cause the at least one remaining delay elements to output an output signal that is a function of the respective periodic signal and that has a frequency that is less than a frequency of the input signal. This configuration can reduce asymmetric aging effects on the delay line.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

Electronic devices, such as semiconductor based digital circuits, can exhibit aging effects over time. The effects of aging can manifest themselves in output signals generated by the aging digital circuits. In particular, in instances where the digital circuits have been operated in the same state for long periods of time, the output signals of such digital circuits may display inconsistent rise and fall times. These longer or inconsistent rise or fall times may, in turn, affect the timing or operation of other digital circuits coupled to the aging digital circuits. For example, in digital circuits such as delay lines, several delay elements are connected in series to form the delay line, such that an output signal of one delay element is fed as an input signal to the next digital element in the delay line. A subset of the total number of delay elements in the delay line can be selected to provide the desired delay. This subset of delay elements are therefore continuously transitioned between logic states. The un-selected delay elements can be maintained in a static state to reduce dynamic power dissipation of circuitry that is not being utilized. But maintaining the un-selected delay elements in a static state can increase the risk or process of aging. As discussed below, instead of maintaining the un-selected delay elements in a static state, the un-selected delay elements can be caused to transition between the logic states.

Figure 1:
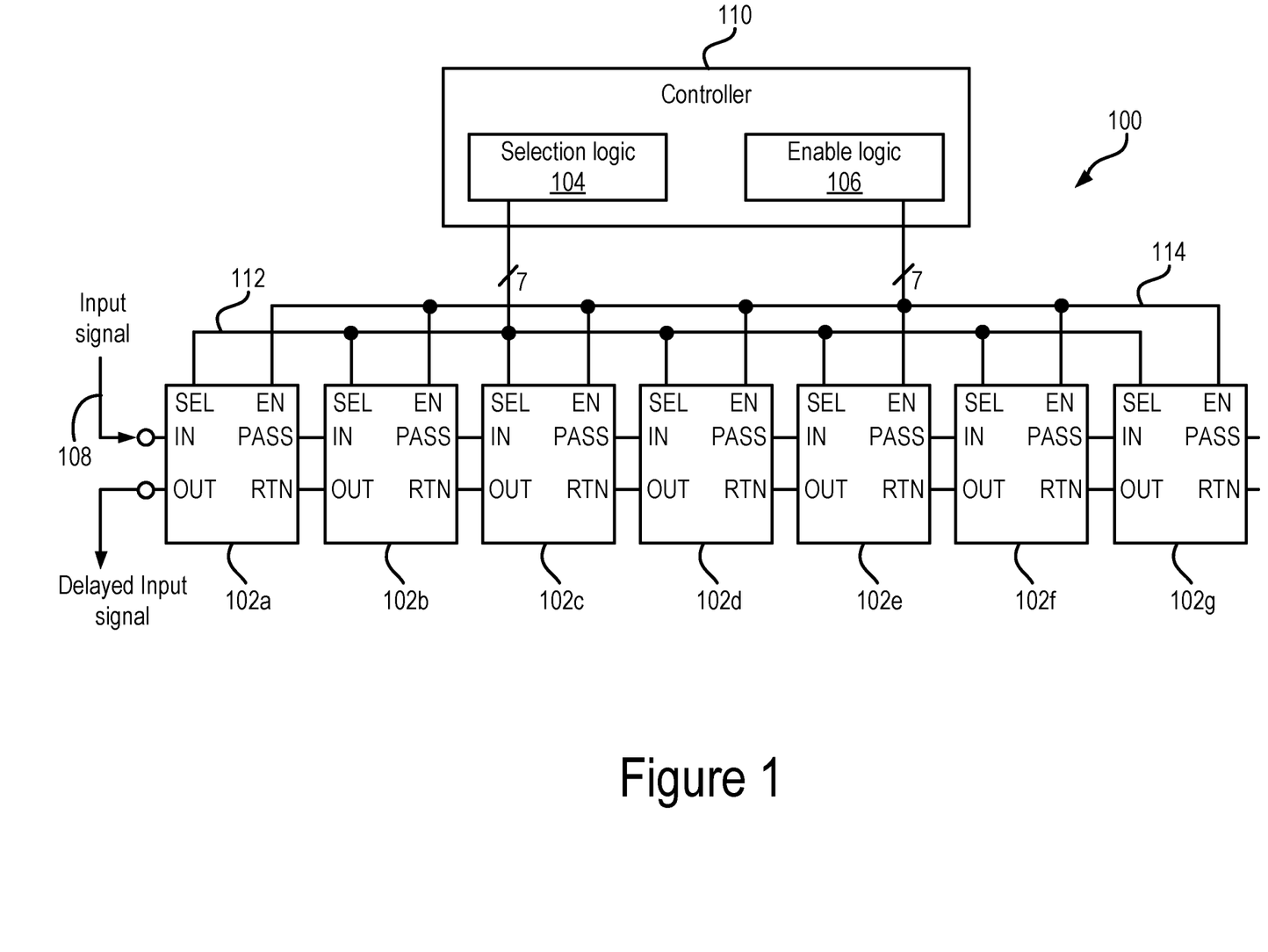
FIG. 1 illustrates a block diagram of an example delay line according to the present embodiments.

FIG. 1 illustrates a block diagram of an example embodiment of a delay line 100. The delay line 100 includes delay elements 102, and a controller 110. The controller 110 can include a delay element selection logic 104 and a delay element enable logic 106. The delay elements 102 includes a first delay element 102a, a second delay element 102b, a third delay element 102c, a fourth delay element 102d, a fifth delay element 102e, a sixth delay element 102f, and a seventh delay element 102g connected in series, in some embodiments. Details of the delay elements 102 are discussed further below. Each delay element 102a-102g can include a signal input (IN), a signal output (OUT), a return signal input (RTN), a pass signal output (PASS), a pass-return selection input (SEL), and an enable signal input (EN). The signal input (IN) of the first delay element 102a can be coupled to a signal source, which provides an input signal 108 that is to be delayed by the delay line 100. The signal source can be another circuit or a signal generator. The pass signal output PASS of each delay element can be connected to the signal input IN of the next delay element (if present) in the delay line 100. For example, the pass signal output PASS of the first delay element 102a can be connected to the signal input IN of the second delay element 102b, the pass signal output PASS of the second delay element 102b can be connected to the signal input IN of the third delay element 102c, and so on. The signal output OUT of each delay element can be connected to the return signal input RTN of the previous delay element (if present) in the delay line 100. For example, the signal output OUT of the seventh delay element 102g can be connected to the return signal input RTN of the sixth delay element 102f, the signal output OUT of the sixth delay element 102f can be connected to the return signal input RTN of the fifth delay element 102e, and so on. The delayed signal is output at the signal output OUT of the first delay element 102a.

The pass-return selection input SEL of each delay element can be coupled to a selection logic 104. The selection logic 104 can select a number of delay elements from the delay line 100 to contribute a delay to the input signal 108. The selection logic 104 can output a selection signal 112 to the pass-return selection input SEL of each of the delay elements 102. That is, the selection logic 104 can output seven selection signals 112, one for each of the seven delay elements 102. Each selection signal 112 may vary between two voltage values or states, such as for example, a high voltage or state ('1') and a low voltage or state ('0'). As discussed further below in relation to FIG. 2, the state '1' or '0' of the selection signal 112 determines whether the signal output OUT of a delay element is provided with the signal at its pass signal output PASS or the signal at its return signal input RTN. The selection logic 104 can provide a '0' selection signal to the last delay element selected to contribute a delay to the input signal, while providing a '1' selection signal to the remaining delay elements.

The enable signal input EN of each delay element is coupled to the enable logic 106. The enable logic 106 can output an enable signal 114 to the enable signal input EN of each of the delay elements 102. The enable logic 106 can enable or disable a delay element from passing an input signal (or a delayed input signal) appearing at its signal input IN to its pass signal output PASS. Each enable signal may vary between two voltage values, such as for example, a high voltage or state ('1') and a low voltage or state ('0').

Figure 2:
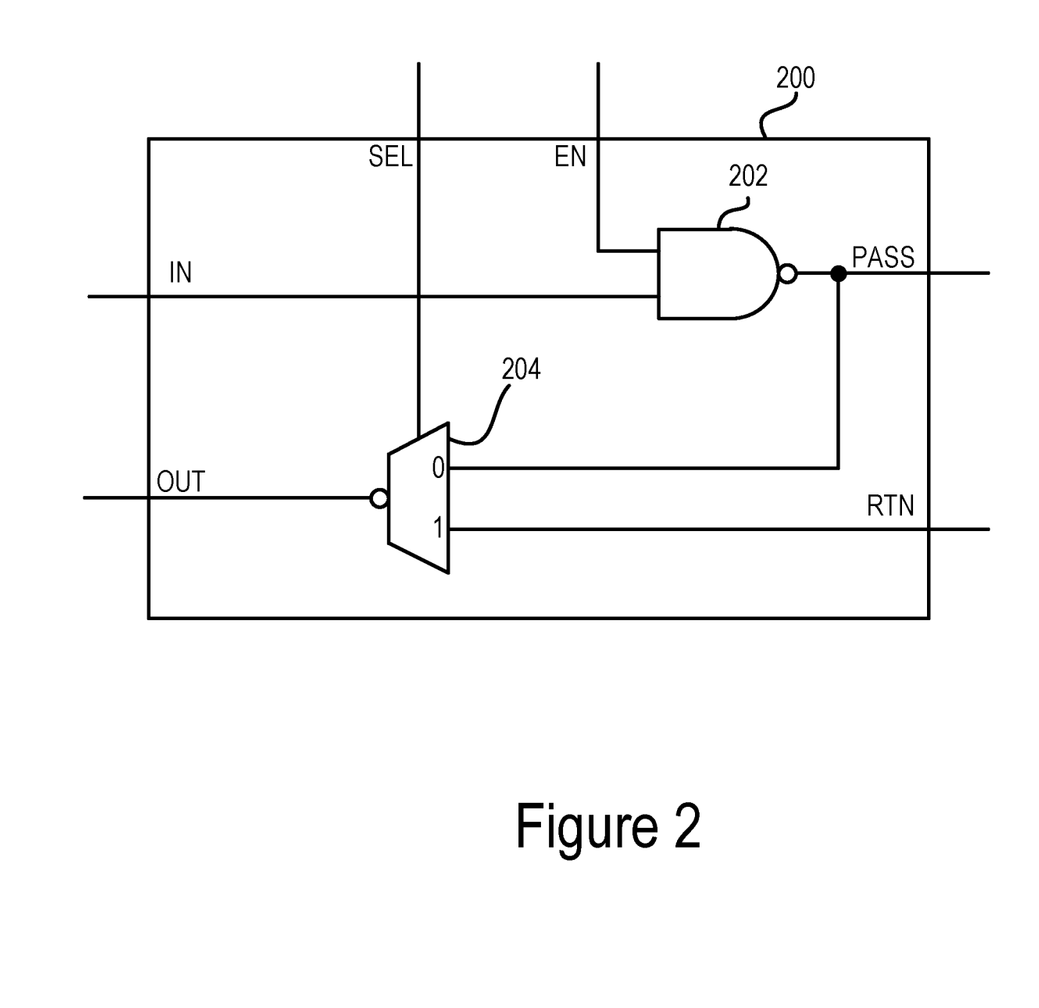
FIG. 2 illustrates a first example delay element according to the present embodiments.

FIG. 2 illustrates a first example delay element 200. In particular, the first example delay element 200 can be used to implement one or more of the delay elements 102 of the delay line 100 shown in FIG. 1. The first example delay element 200, similar to the delay elements 102 shown in FIG. 1, includes a signal input (IN), a signal output (OUT), a return signal input (RTN), a pass signal output (PASS), a pass-return selection input (SEL), and an enable signal input (EN). The first example delay element 200 can include a NAND gate 202 and a mux 204. The signal input IN of the first example delay element 200 can be connected to a first input of the NAND gate 202, while the enable signal input EN of the first example delay element 200 can be connected to a second input of the NAND gate 202. The output of the NAND gate 202 may be connected to the pass signal output PASS of the first example delay element 200. Further, the return signal input RTN can be connected to a first input (labeled "1") of the mux 204, while the pass signal output PASS can be connected to a second input (labeled "0") of the mux 204. A selection input of the mux 204 is connected to the pass-return selection input SEL, while the output of the mux 204 is connected to the signal output OUT of the first example delay element 200. In one example implementation, the NAND gate 202 and the mux 204 can be implemented using a complementary metal-oxide semiconductor (CMOS) technology. In some other example implementations, the NAND gate 202 and the mux 204 can be implemented in transistor-transistor logic (TTL), or other technologies.

During operation, an input signal can be received at the signal input IN of the first example delay element 200. If the first example delay element 200 is selected to contribute to delaying the input signal, and if it is not the last delay element in the set of delay elements selected to contribute to the delay, then the first example delay element 200 can receive a '1' selection signal at the pass-return selection input SEL. Receiving a '1' selection signal at the pass-return selection input SEL can result in the mux 204 selecting the signal at the return signal input RTN, connected to the first input of the mux 204, for output at the signal output OUT of the first example delay element 200. If the first example delay element 200 is selected to contribute to delaying the input signal, and if it is the last delay element in the set of delay elements selected for contributing to the delay, then the first example delay element 200 can receive a '0' selection signal at the pass-return selection input SEL. Receiving the '0' selection signal at the pass-return selection input SEL can result in the mux 204 selecting the signal at the pass signal output PASS, connected to the second input of the mux 204, to output at the signal output OUT of the first example delay element 200.

As mentioned above, the enable signal input EN of the first example delay element 200 is provided to the first input of the NAND gate 202, the second input of which receives the input signal received at the signal input IN. The first example delay element 200 can receive a '1' enable signal 114 at the enable signal input EN if the first example delay element 200 is selected to contribute to delaying the input signal. With one of the inputs of the NAND gate 202 being a logic '1', the output of the NAND gate 202 is an inverted input signal received at the signal input IN of the first example delay element 200. If however the first example delay element 200 is not selected to contribute to delaying the input signal, the first example delay element 200 can receive a '0' enable signal 114 at the enable signal input EN. With one of the inputs to the NAND gate 202 being at logic '0', the output of the NAND gate 202 is at logic '1'. The NAND gate 202 outputs a logic '1' regardless of the state of the input signal.

In some implementations, the first example delay element 200 can include other clock-gating configurations or logic gates instead of the NAND gate 202. For example, the first example delay element 200 can include a two input inverting multiplexer instead of the NAND gate 202, where one input of the inverting multiplexer is coupled to the signal input IN, a second input is maintained at a logic '0', and the control input is coupled to the enable signal input EN.

Figure 3:
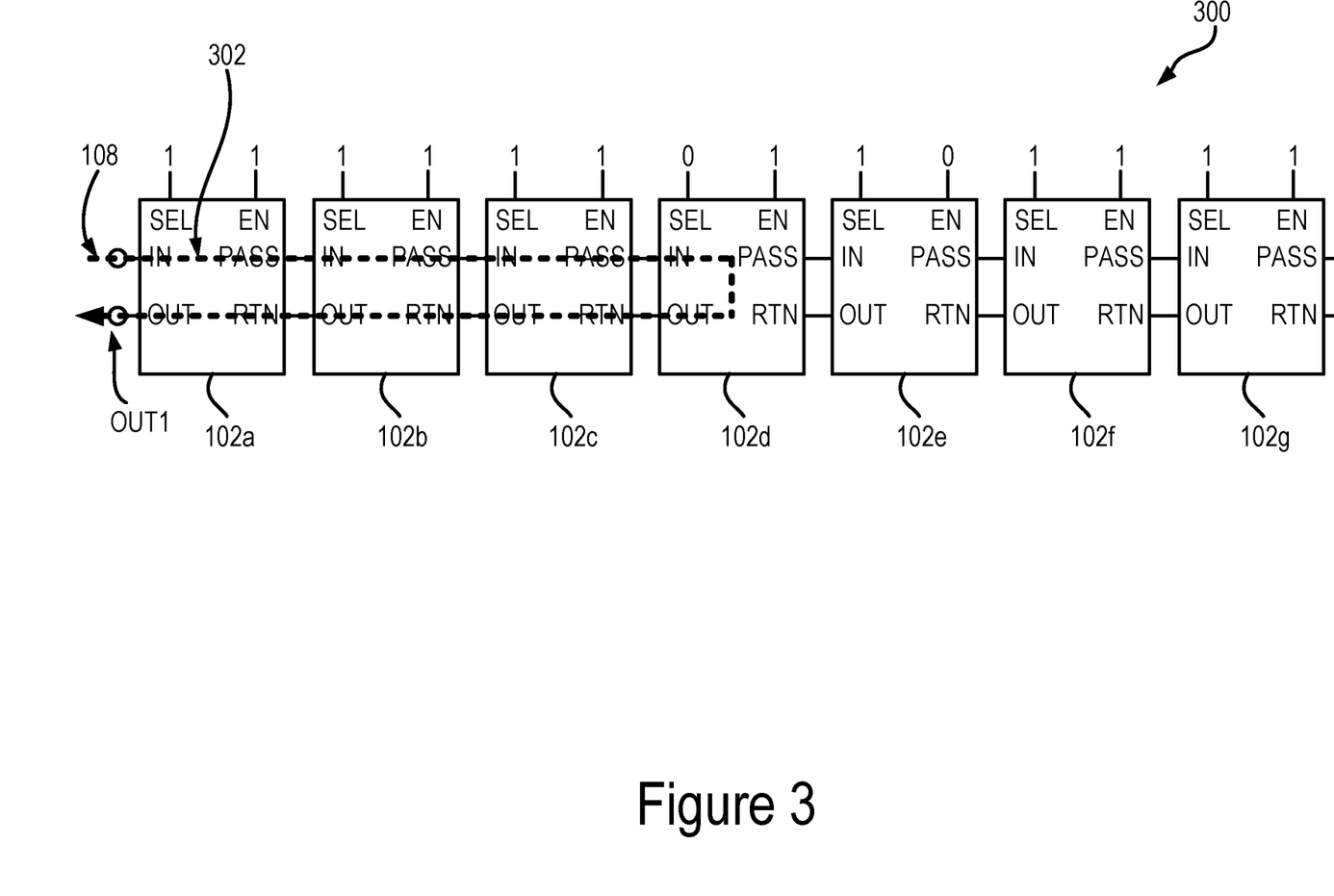
FIG. 3 shows another example delay line according to the present embodiments.
Figure 4:
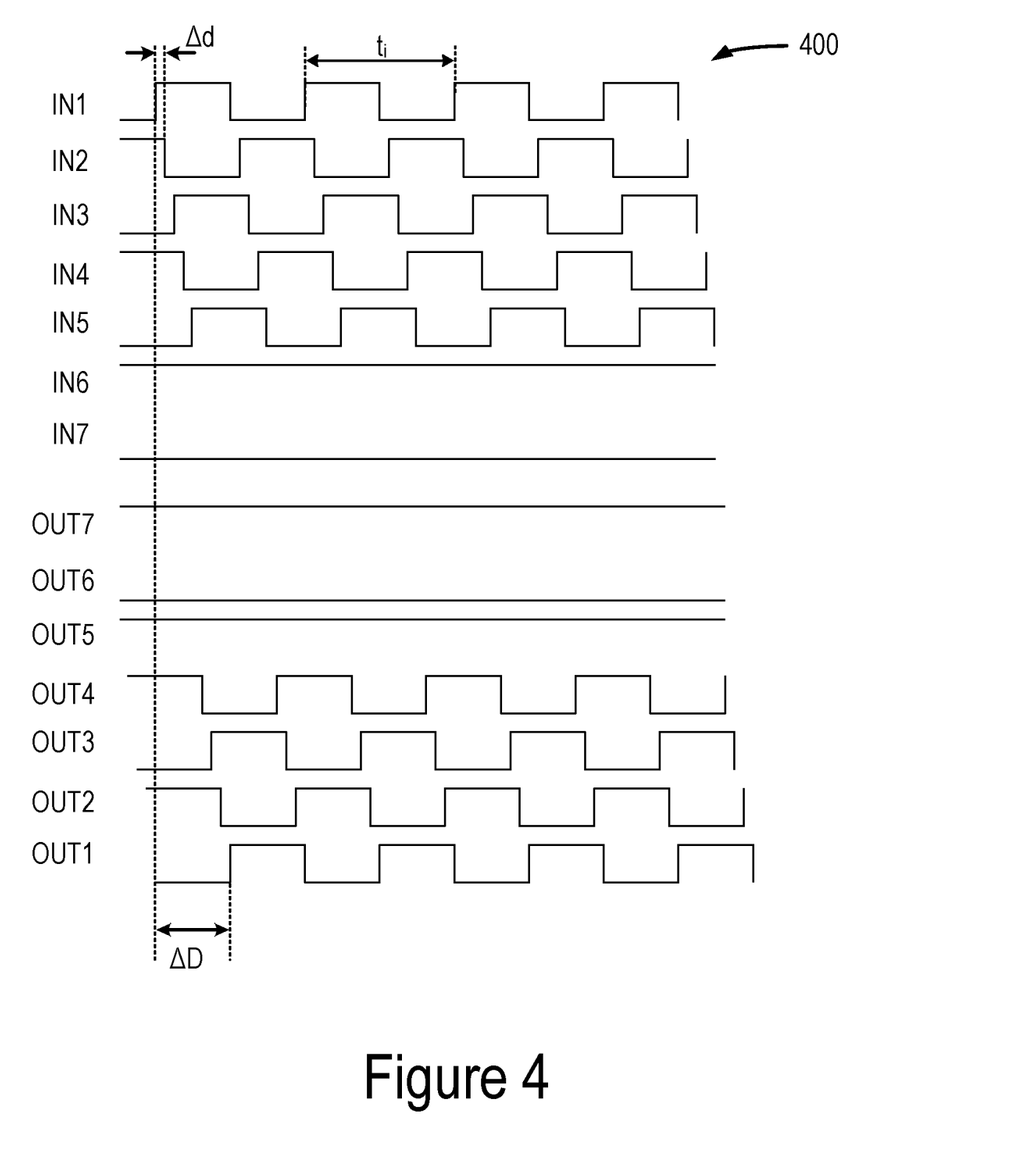
FIG. 4 illustrates a timing diagram of various signals of the delay line shown in FIG. 3.

FIG. 3 shows another example delay line 300. In particular, FIG. 3 illustrates a single path 302 of an input signal 108 based on the selection of the first, second, third, and fourth delay elements 102a-102d of the delay line 100 for contributing a delay to the input signal 108. FIG. 3 also illustrates the states of selection signals and the enable signals at each delay element. FIG. 4 illustrates a timing diagram 400 showing the state of the signals at the signal input IN and signal output OUT of each of the seven delay elements 102.

Referring to the first delay element 102a, the signal input IN of the first delay element 102a receives the input signal 108, which is to be delayed by the delay line 300. The input signal 108 can be a digital signal that transitions between a high voltage or state ('1') and a low voltage or state ('0') at a frequency of $1/t_i$, where $t_i$ is the time period of the input signal. The input signal 108 also can have a 50% duty cycle. However, the 50% duty cycle shown in FIG. 4 is only an example, and that the input signal 108 can have a duty cycle of any proportion or ratio. The enable logic (106, FIG. 1) provides a '1' enable signal to the enable signal input EN of the first delay element 102a. Thus, the NAND gate (202, FIG. 2) shall invert the input signal 108 to generate an inverted signal at its pass signal output PASS, which is connected to the signal input IN of the second delay element 102b. The NAND gate of the first delay element 102a adds a delay of Δd seconds to the input signal 108, and provides the delayed input signal (IN2) to the signal input IN of the second delay element 102b. The enable logic (106, FIG. 1) also provides a '1' enable signal to the enable signal input EN of the second delay element 102b. As a result, the NAND gate of the second delay element 102b also delays the input signal IN2 by Δd seconds and provides the delayed input signal (IN3) to the third delay element 102c. In a manner similar to the first and the second delay elements 102a and 102b, the third and the fourth delay elements 102c and 102d also each add a delay of Δd seconds to their respective input signals (IN3 and IN4) to generate delayed output signals (IN4 and IN5).

The selection logic (104, FIG. 1) provides a '0' selection signal at the pass-return selection input SEL of the fourth delay element 102d. Thus, the mux (204, FIG. 2) of the fourth delay element 102d selects signal at the pass signal output PASS (IN5) of the fourth delay element 102d, inverts it, and provides the inverted signal (OUT4). While not shown, the mux 204 can also contribute an additional delay due to the multiplexing and the inversion operation. The signal at the return signal input RTN of the fourth delay element 102d is ignored by the mux of the fourth delay element 102d. Thus, the fourth delay element provides the OUT4 signal to the return signal input RTN of the third delay element 102c. The third delay element 102c receives a '1' at its pass-return selection input SEL. Thus, the mux (204, FIG. 2) of the third delay element 102c selects the signal at its return signal input RTN, inverts the signal, and provides the inverted signal (OUT3) to the return signal input RTN of the second delay element 102b. Again, the mux of the third delay element 102c may also impart a delay to the input delayed input signal. In a similar manner, the second delay element 102b and the first delay element 102a, each of which receive a '1' select signal at their respective pass-return selection input SEL, select and invert the signal received at their respective return signal input RTN and provide the inverted signal at their respective signal output OUT. FIG. 4 shows the OUT2 and OUT1 signals at the signal outputs OUT of the second and the first delay elements 102b and 102a. The OUT1 signal at the signal output OUT of the first delay element 102a is delayed by ΔD based on the delays contributed by the selected delay elements. The selection logic can thus select the number of delay elements for contributing a delay to the input signal 108 by providing a '1' selection signal to the pass-return selection input SEL of all the selected delay elements except the last of the selected delay element, to which the selection logic provides a '0' selection signal.

Turning to the un-selected delay elements, i.e., the fifth delay element 102e, the sixth delay element 102f and the seventh delay element 102g, the enable signal input EN of the fifth delay element 102e receives a '0' enable signal (form the enable logic), causing the output of the NAND gate (202, FIG. 2) to be a constant signal with logic state '1' (IN6, FIG. 4). This signal is passed on to the signal input IN of the sixth delay element 102f, which receives a '1' enable signal at its enable signal input EN. As a result, the NAND gate of the sixth delay element 102f again inverts the signal, such that the signal at the pass signal output PASS of the sixth delay element 102f is a logic '0'. Similarly, the seventh delay element 102g, which also receives a logic '1' at its enable signal input EN, inverts the signal at its signal input IN (IN7). The pass-return selection input SEL of each of the fifth delay element 102e, the sixth delay element 102f and the seventh delay element 102g receive a '1' selection signal. Thus, the mux (204, FIG. 2) of each of these delay elements selects the signal provided at its respective return signal input RTN, inverts the signal, and provides the inverted signal at the respective signal output OUT. Assuming that the return signal input RTN of the seventh delay element 102g is provided with a constant voltage state of '0', the OUT7, OUT6, and OUT5 of the seventh, sixth, and the fifth delay elements 102g, 102f, and 102e is at logic state '1', logic state '0', and logic state '1', respectively, as shown in FIG. 4. In some implementations, the return signal input RTN of the seventh delay element 102g can be provided with the signal at the pass signal output PASS. In some other implementations, the pass-return selection input SEL of the seventh delay element 102g can be provided with a '0' selection signal, such that the mux (204, FIG. 2) directs the signal at the pass signal output PASS to the signal output OUT.

During prolonged operation of the delay line 300, un-selected delay elements may be disposed in the same respective state (logic '0' or logic '1'), while the selected delay elements can transition between the logic '0' and logic '1' state at a frequency of the input signal 108. In some instances, the prolonged disposition of a delay element in a single state may cause aging. Aging may be caused due to negative bias temperature instability (NBTI), which can result in a change in the threshold voltage of the p-type transistors. This change in the threshold voltage of the p-type transistors may result in a change in the delay imparted by the p-type transistor used in the delay element. That is, the change in delay imparted by the p-type transistors may affect the rise time of the output signal of the delay element. As the n-type transistors are less affected by aging, the fall times would remain relatively unchanged. This can create an imbalance in the delay offered by the delay element, and may change the duty cycle of the output signal relative to that of the input signal or the amount of delay offered by the delay element. One approach to mitigating the aging effect could be to provide the input signal also to the un-selected delay elements such that the un-selected delay elements can also transition between the logic '1' and logic '0' states at the same frequency as the selected delay elements. For example, referring to FIG. 3, the enable signal input EN of the fourth delay element 102d can be provided with a '0' enable signal, such that the delayed input signal, and not a constant logic '1' signal is provided to the un-selected delay elements. However, this increases the power consumption of the un-selected delay elements, and of the delay line. As discussed below, the aging of the un-selected delay elements can be mitigated or avoided by operating the delay line in a manner such that the un-selected delay elements are transitioned between the logic '1' and logic '0' states, but at a frequency that is less than that of the input signal (e.g., to provide power reduction of at least a specified proportion or amount), but high enough to reduce or mitigate the effects of aging in the delay elements.

Figure 5:
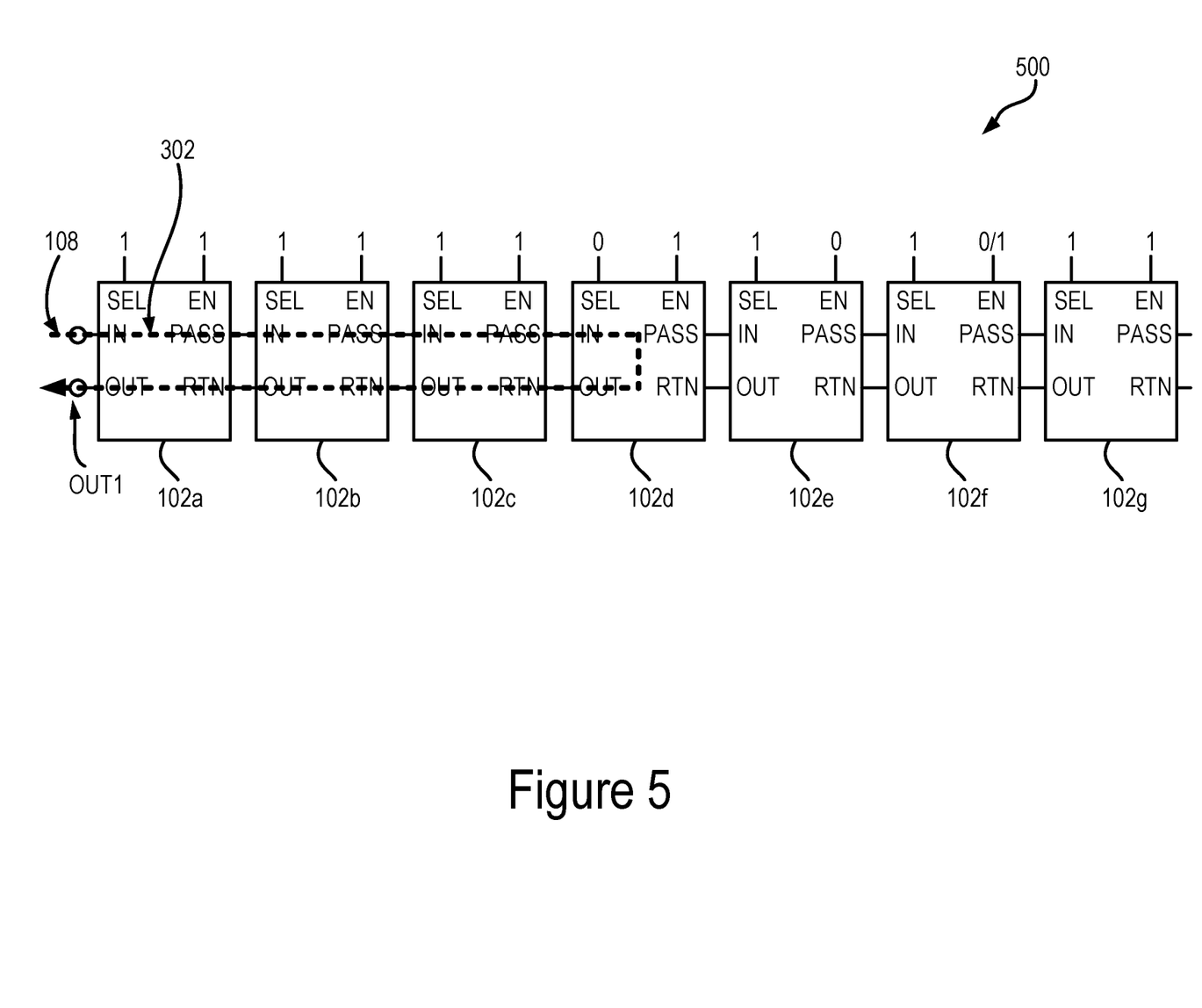
FIG. 5 illustrates a delay line with aging mitigating features according to the present embodiments.

FIG. 5 illustrates a delay line 500 with aging mitigating features. The delay line 500 is configured in a manner similar to that of the delay line 300 shown in FIG. 3, in that the first four delay elements (102a-102d) are selected to contribute delay to the input signal 108, and the last three delay elements (102e-102g) are un-selected from contributing delay to the input signal. However, the enable signal to at least the sixth delay element 102f is not maintained constant at logic state '1'. Instead, the enable logic 106 toggles the enable signal between the logic '1' state and the logic '0' state at a frequency that is substantially lower than a frequency of the input signal 108.

Figure 6:
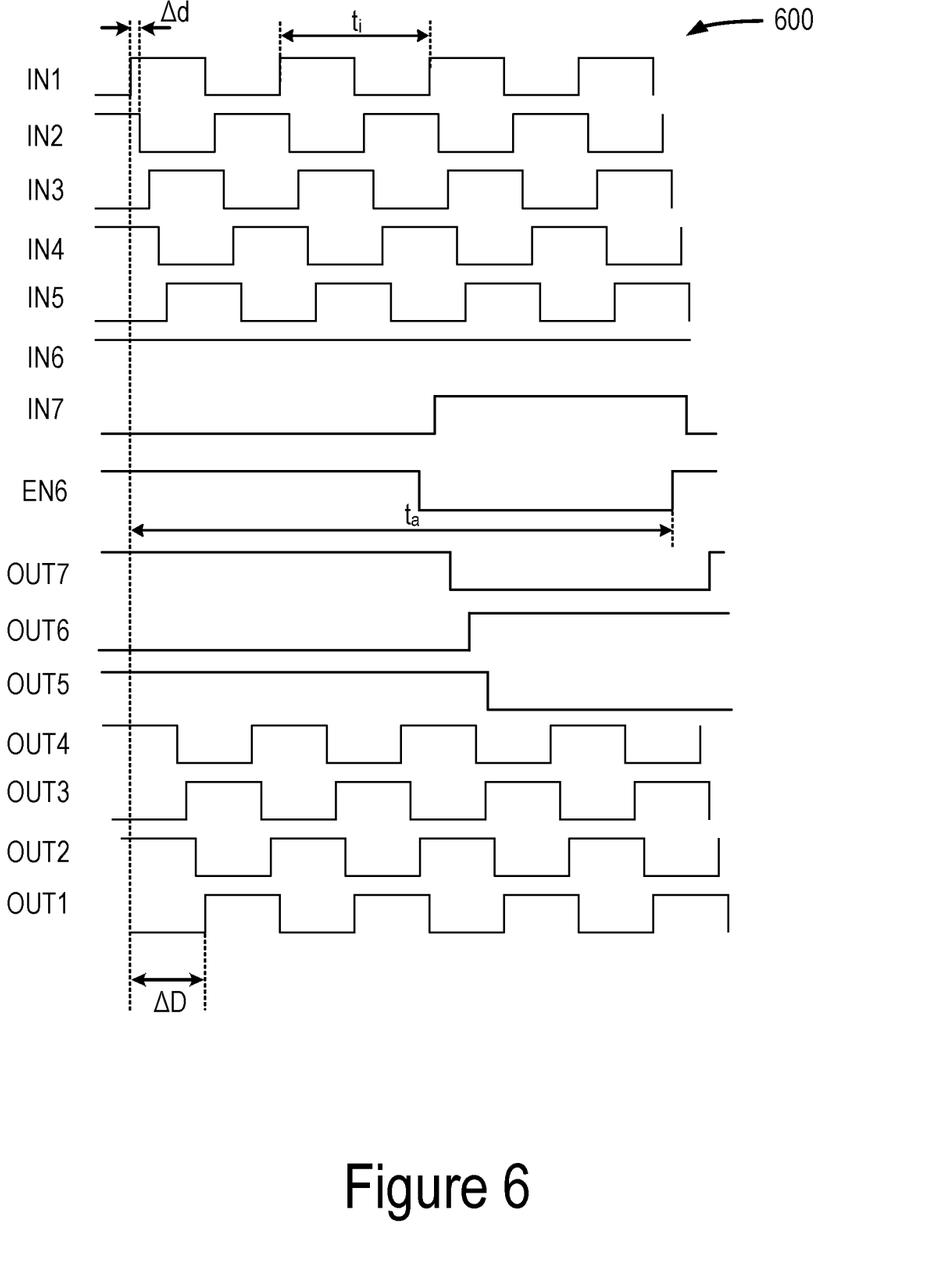
FIG. 6 illustrates a timing diagram associated with signals of the delay line shown in FIG. 5.

FIG. 6 illustrates a timing diagram 600 associated with signals of the delay line 500 shown in FIG. 5. In particular, FIG. 6 shows the toggling of the enable signal EN6 of the sixth delay element 102f. The enable signal EN6 of the sixth delay element 102f toggles between the logic state '1' and the logic state '0' with frequency that is equal to $1/t_a$, with $t_a$ illustrated in FIG. 6, e.g., as a period of the enable signal EN6. The enable signal EN6 can have any duty cycle, such as, for example, a 50% duty cycle. Referring to FIG. 5, because the fifth delay element 102e receives a '0' enable signal at its enable signal input EN, the fifth delay element 102e outputs a logic '1' signal at its pass signal output PASS. Thus, the signal IN6 at the signal input IN of the sixth delay element 102f is also a logic '1' signal. The NAND gate of the sixth delay element 102f receives a logic '1' signal from the signal input IN at one of its inputs and a toggling enable signal (shown as '0/1') at its other input. Therefore, the NAND gate generates at its output an inverted enable signal. As shown in FIG. 6, the signal IN7 at the signal input IN of the seventh delay element 102g is an inverted and delayed enable signal EN6. Thus, the NAND gates of both the sixth delay element 102f and the seventh delay element 102g transition between logic '1' and logic '0' states, while not contributing to the delay of the input signal 108.

In some implementations, the pass signal output PASS of the seventh delay element 102g (or last of the series-connected delay elements) can be externally connected to the return signal input RTN of the seventh delay element 102g. Thus, as the seventh delay element 102g receives a '1' selection signal at its pass-return selection input SEL, the signal at the pass signal output PASS is inverted and provided to the signal output OUT of the seventh delay element 102g. In some other implementation, where the pass signal output PASS is not externally connected to the return signal input RTN, the selection logic (104, FIG. 1) can instead provide a '0' selection signal at the pass-return selection input SEL of the seventh delay element 102g such that the mux selects the signal at the pass signal output PASS and provides an inverted signal to the signal output OUT of the seventh delay element 102g. In either case, the signal at the signal output OUT of the seventh delay element 102g can be a delayed version of the signal IN7 at its signal input IN. The signal at the signal output OUT of the seventh delay element 102g is provided to the return signal input RTN of the sixth delay element 102f. As the pass-return selection input SEL of the sixth delay element 102f receives a '1' selection signal, the mux of the sixth delay element 102f delays and inverts the signal at its return signal input RTN and provides the delayed and inverted signal OUT6 at its signal output OUT. Similarly, the mux of the fifth delay element 102e also inverts and delays the signal at its return signal input RTN, and provides the delayed an inverted signal OUT5 at its signal output OUT. As the pass-return selection input SEL of the fourth delay element 102d receives a '0' selection signal, the fourth delay element 102d ignores (or does not use) the signal OUT5 provided by the fifth delay element 102e. Thus, the mux of each of the un-selected delay elements is made to transition between the logic '1' and logic '0' states while not contributing to the delay of the input signal 108.

In some implementations, the enable signal of the fifth delay element 102e can be toggled instead of the sixth delay element 102f. If the enable signal of the fifth delay element 102e is toggled, at least a portion of the signal at the signal output OUT of the fifth delay element may have a frequency similar to the frequency of the input signal. This may result in an increase in the power consumption of the un-selected delay elements, but also ensures that the NAND gate of the fifth delay element 102e is made to transition between the logic '1' and logic '0' state.

In some implementations, the enable signal can be derived from the input signal 108 received at the signal input IN of the first delay element 102a. For example, controller 110, and the enable logic 106 in particular, can include additional circuitry such as a frequency or clock divider, which can receive the input signal 108 as an input and generate the toggle enable signal having a frequency that is a fraction (or other function) of the frequency of the input signal 108.

Figure 7:
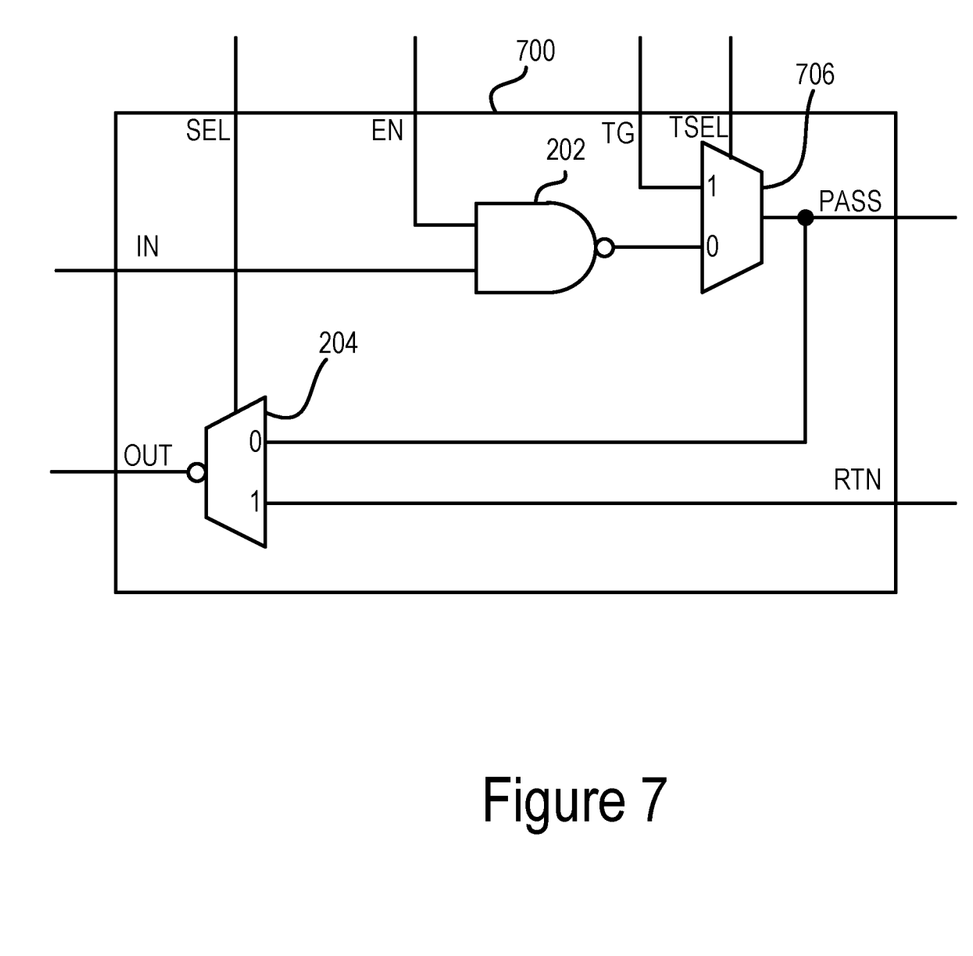
FIG. 7 illustrates a second example delay element according to the present embodiments.

FIG. 7 illustrates a second example delay element 700. The second example delay element can be used to implement the delay line 100 shown in FIG. 1. The second example delay element 700 is similar to the first example delay element 200 shown in FIG. 1, in that like the delay element 200, the second example delay element 700 also includes a NAND gate 202 and a mux 204. The second delay element additionally includes a second mux 706, a toggle input TG, and a toggle mux select input TSEL. The second mux 706 is positioned such that the output of the NAND gate 202 is provided to a first input of the second mux 706 and a toggle signal at the toggle input TG is provided to a second input of the second mux 706. The output of the second mux 706 is provided to the pass signal output PASS, as well as the first input of the mux 204. The controller 110 can provide a '1' toggle mux select input at the toggle mux select input TSEL, causing the second mux 706 to select the toggle signal provided at the toggle input TG, and provide the toggle signal to the pass signal output PASS and to the input of the mux 204. The controller 110 can alternatively provide a '0' toggle mux select input at the toggle mux select input TSEL, causing the second mux 706 to select the output of the NAND gate 202, and provide the output of the NAND gate to the pass signal output PASS and to the input of the mux 204.

During operation, if a second example delay element 700 is selected to contribute a delay to an input signal, then the controller 110 can provide a '0' toggle mux select signal at the toggle mux select input TSEL, causing the pass signal output PASS and the mux 204 to receive the output of the NAND gate 202. On the other hand, if the second example delay element 700 is un-selected, then the controller 110 can provide a '1' toggle mux select signal at the toggle mux select input TSEL, and a toggle signal at the toggle input TG, such that the toggle signal at the toggle input TG is provided to the pass signal output PASS, and to the following delay element. The toggle signal at the toggle input TG can have a frequency of about $1/t_a$, causing the output of the second mux 206 to also have a frequency of about $1/t_a$. The toggle signal can cause the circuitry in the following un-selected delay elements to toggle between the logic '1' and the logic '0' states, reducing the risk of aging of the circuitry. It should be noted that the enable signal at the enable signal input EN is not toggled, like in the first example delay element 200 discussed above in relation to FIG. 6. Instead, the controller 110 maintains the enable signal to a logic '1' state if the delay element is un-selected. It should be noted that the addition of the second mux 706 adds additional delay to the input signal, compared to the delay added by the first example delay element 200. Thus, the controller 110 may have to take the delay in account in determining the number of delay elements, such as the second example delay element 700, to be selected to contribute to delaying the input signal 108.

Figure 8:
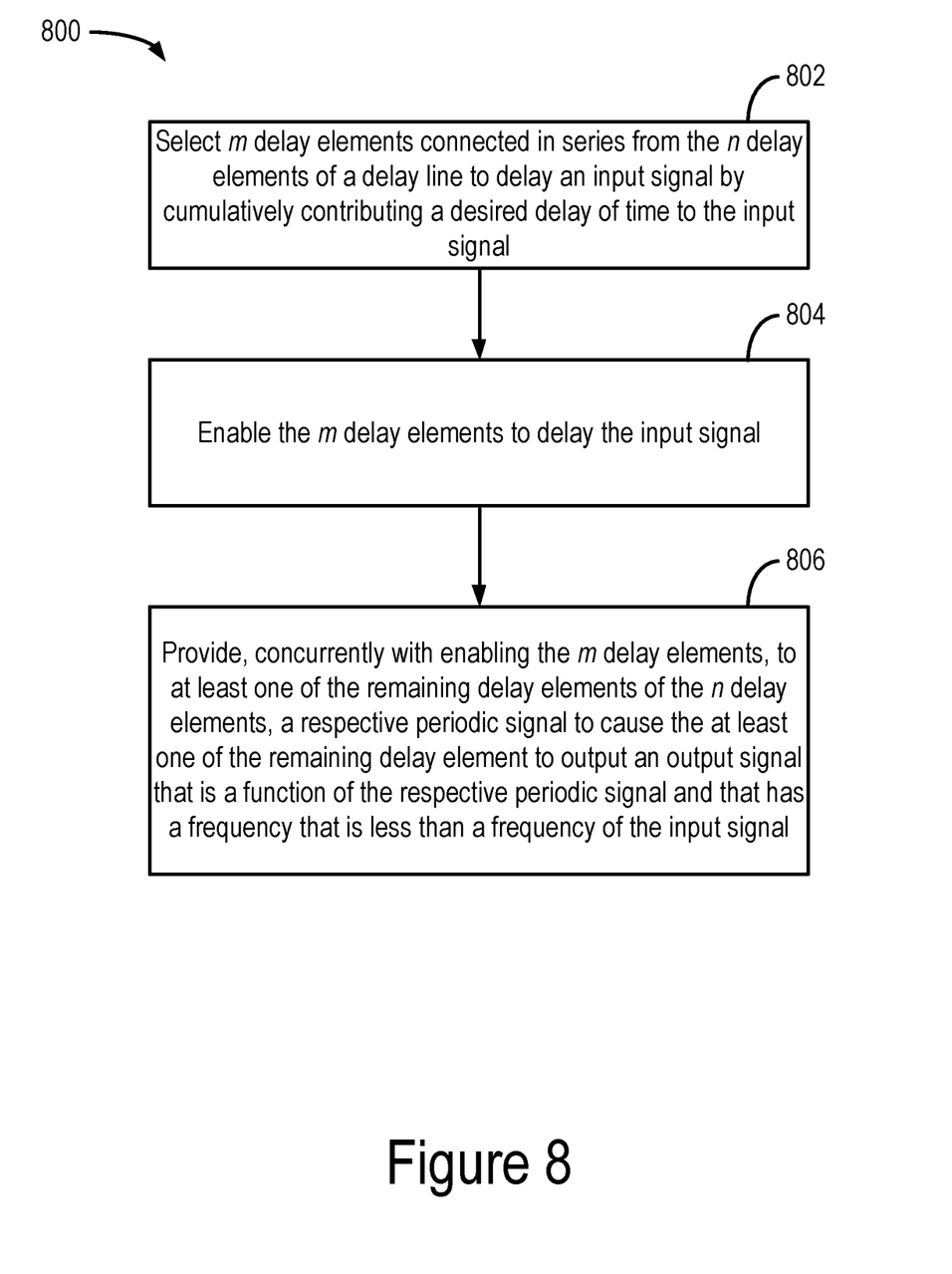
FIG. 8 illustrates a flow diagram of a process to operate a delay line according to the present embodiments.

FIG. 8 illustrates a flow diagram of an embodiment of a process 800. The process 800 can be executed, for example, by the controller 110 of the delay line 100. The process 800 includes selecting m delay elements connected in series from the n delay elements to delay an input signal by cumulatively contributing a desired delay of time to the input signal (stage 802). At least one example of this process stage has been discussed above in relation to FIGS. 1-7. For example, referring to FIG. 3, the selection logic 104 can generate selection signals for each of the seven delay elements 102 to select four delay elements out of the seven delay elements to delay the input signal 108, or any subset of the m delay elements. To select the first four delay elements 102a-102d for instance, the selection logic 104 can provide a '1' selection signal to each of the first delay element 102a, the second delay element 102b and the third delay element 102c. The selection logic 104 also can provide a '0' selection signal to the last of the selected delay elements, the fourth delay element 102d.

The process 800 further includes enabling, using or causing the m delay elements to delay the input signal (stage 804). At least one example of this process stage has been discussed above in relation to FIGS. 1-7. For example, the enable logic 106 can generate an enable signal for each of the seven delay elements 102. In particular, the enable logic 106 can generate and provide a '1' enable signal to each of the selected delay elements. By providing the '1' enable signal to each of the selected delay elements, the enable logic 106 can cause the NAND gates of the selected delay elements to invert and delay their respective input signals. That is, the first, second, third, and fourth delay elements 102a-102d can delay and invert the signal received at their respective signal input IN and provide the delayed and inverted signal at their respective pass signal output PASS. The process 800 also includes providing, concurrently with enabling the m delay elements, to at least one of the remaining delay elements of the n delay elements, a respective periodic signal to cause the at least one of the remaining delay elements to output an output signal that is a function of the respective periodic signal and that has a frequency that is less than a frequency of the input signal (stage 806). At least one example of this process stage has been discussed above in relation to FIGS. 1-7. For example, the enable logic 106 can generate a toggle enable signal that transitions between the logic state '1' and the logic state '0' with frequency that is equal to $1/t_a$. The enable logic 106 can provide the toggle enable signal EN6 to an unused or unselected delay element, for instance the sixth delay element 102f, causing the NAND gate 202 of the sixth delay element to output a signal on the pass signal output PASS that also transitions between the logic state '1' and the logic state '0' with frequency that is equal to $1/t_a$. As another example, the controller 110 can provide a toggle signal to the toggle input TG of the second example delay element 700 shown in FIG. 7. This causes the output of the second mux 706 to also output a signal at the same frequency as that of the toggle signal. As mentioned above, providing the periodic signal to the un-selected delay elements can cause the circuitry in the delay elements, or the circuitry in the following delay elements in the delay line, to transition between the logic '1' state and the logic '0' state. This reduces the risk of aging that can be caused by the circuitry being static in a single state.

Although the present embodiments have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. A delay line, comprising:
   n delay elements connected in series;
   a delay element selection logic configured to select m delay elements connected in series from the n delay elements to delay an input signal by cumulatively contributing a desired delay of time to the input signal; and
   a delay element enable logic configured to concurrently:
   enable the m delay elements to delay the input signal, and
   provide, to at least one of (n–m) remaining delay elements of the n delay elements, a respective periodic signal to cause the at least one of the (n–m) remaining delay elements to output an output signal that is a function of the respective periodic signal, and that has a frequency that is less than a frequency of the input signal.

2. The delay line of claim 1, wherein the delay element enable logic is configured to, for the at least one of the (n–m) remaining delay elements, output the respective periodic signal to transition between a first state and a second state.

3. The delay line of claim 2, wherein the delay element enable logic is configured to, for each of the m delay elements, provide a respective non-periodic signal at the first state.

4. The delay line of claim 3, wherein each of the (n–m) remaining delay elements is configured to output the output signal as a function of the respective periodic signal or non-periodic signal and an input signal of the corresponding delay element in the delay line.

5. The delay line of claim 4, wherein a last delay element of the m delay elements connected in series is configured to return a delayed input signal back to a preceding delay element of the m delay elements connected in series.

6. The delay line of claim 5, wherein at least one delay element of the m delay elements, other than the last delay element, is configured to provide the delayed input signal received from a following delay element to a preceding delay element.

7. The delay line of claim 1, wherein the delay element enable logic is configured to derive the periodic signal from the input signal by frequency dividing the input signal by a dividing factor.

8. The delay line of claim 1, wherein the input signal is a clock signal, or a signal having a 50% duty cycle.

9. The delay line of claim 1, wherein each of the n delay elements includes a complementary metal oxide semiconductor (CMOS) delay element.

10. A method for operating a delay line having n delay elements connected in series, comprising:
   selecting m delay elements connected in series from the n delay elements to delay an input signal by cumulatively contributing a desired delay of time to the input signal;
   enabling the m delay elements to delay the input signal; and
   providing, concurrently with enabling the m delay elements and disabling (n−m) remaining delay elements, to at least one of the (n−m) remaining delay elements of the n delay elements, a respective periodic signal to cause the at least one of the (n−m) remaining delay elements to output an output signal that is a function of the respective periodic signal and that has a frequency that is less than a frequency of the input signal.

11. The method of claim 10, wherein the periodic signal transitions between a first state and a second state.

12. The method of claim 11, further comprising providing a respective non-periodic signal to each of the m delay elements at the first state.

13. The method of claim 12, further comprising returning a delayed input signal of a last delay element of them delay elements connected in series to a preceding delay element.

14. The method of claim 13, further comprising deriving the periodic signal from the input signal by frequency dividing the input signal by a dividing factor.

15. A delay line comprising:
   a first delay element having a first signal input, a first signal output, a first return signal input, a first pass signal output, a first pass-return selection input, and a first activation signal input, comprising:
      a first gated logic configured to receive an input signal at the first signal input, receive an enable signal at the first activation signal input, generate a first output signal that is a delayed function of the input signal, and provide the first output signal at the first pass signal output, and
      a first selection logic configured to receive a first pass-select signal at the first pass-return selection input, and, in response, select the first output signal to pass to the first signal output; and
   a second delay element having a second signal input, a second signal output, a second return signal input, a second pass signal output, a second pass-return selection input, and a second activation signal input, comprising:
      a second gated logic configured to receive at the second signal input a second input signal, receive a periodic signal at the second activation signal input, and in response, generate a second output signal that is a function of the periodic signal, and provide the second output signal at the second pass signal output, and
      a second selection logic configured to receive a second return-select signal at the second pass-return selection input, and select a return signal at the second return signal input to be output at the second signal output.

16. The delay line of claim 15, wherein the periodic signal transitions between a first state and a second state at a frequency that is less than a frequency of the input signal.

17. The delay line of claim 16, further comprising a third delay element positioned between the first delay element and the second delay element, having a third signal input connected to the first pass signal output, a third pass signal output connected to the second signal input, a third return signal input connected to the second signal output, a third signal output connected to the first return signal input, a third pass-return selection input, and a third activation signal input, comprising:
   a third gated logic configured to receive at the third signal input the first output signal directly from the first delay element, receive a deactivation signal at the third activation signal input, and generate at the third pass signal output the second input signal that is a function of the deactivation signal, wherein the deactivation signal at the third activation signal input is maintained at the first state concurrently with providing the periodic signal at the second activation signal input, and
   a third selection logic configured to receive a third return-select signal at the third pass-return selection input, and select the return signal at the third return signal input to be output at the third signal output.

18. The delay line of claim 15, wherein the input signal comprises a clock signal, or a signal having a 50% duty cycle.

19. The delay line of claim 15, wherein each of the first delay element and the second delay element includes a complementary metal oxide semiconductor (CMOS) delay element.

20. The delay line of claim 15, wherein each of the first gated logic is configured to generate the first output signal that is a delayed inverse function of the input signal, and wherein the first selection logic is configured to invert the first output signal before passing it to the first pass signal output.

* * * * *